United States Patent [19]

Hara et al.

[11] Patent Number: 4,839,609
[45] Date of Patent: Jun. 13, 1989

[54] DIFFERENTIAL AMPLIFIER

[75] Inventors: Hiroyuki Hara, Sumida; Yasuhiro Sugimoto, Yokohama, both of Japan

[73] Assignee: Kabushiki Kaisha Toshiba, Kawasaki, Japan

[21] Appl. No.: 173,657

[22] Filed: Mar. 25, 1988

[30] Foreign Application Priority Data

Mar. 27, 1987 [JP] Japan .................................. 62-71881

[51] Int. Cl.[4] ............................................... H03F 3/45
[52] U.S. Cl. ..................................... 330/253; 330/257; 330/300; 330/311
[58] Field of Search ................. 330/253, 300, 311, 257

[56] References Cited

U.S. PATENT DOCUMENTS

| | | | |
|---|---|---|---|
| 4,387,309 | 6/1983 | Shacter | 330/253 X |
| 4,390,850 | 6/1983 | Davis et al. | 330/253 |
| 4,406,990 | 9/1983 | Noro | 330/311 X |
| 4,538,114 | 8/1985 | Kunimi et al. | 330/253 |
| 4,600,893 | 7/1986 | Sugimoto | 330/252 |

Primary Examiner—James B. Mullins
Attorney, Agent, or Firm—Foley & Lardner, Schwartz, Jeffery, Schwaab, Mack, Blumenthal & Evans

[57] ABSTRACT

To provide a high-speed wide-dynamic range differential amplifier, the amplifier comprises first and second FETs having source terminals connected to each other and a constant current source connected between the sources and ground; third and fourth bipolar transistors complementary to the first and second FETs, having base terminals connected to a first bias voltage in common and emitter terminals connected to the drains of the first and second FETs and a supply voltage via resistors, respectively; and a current mirror circuit composed of fifth and sixth FETs of the same conductive type as the first and second FETs.

6 Claims, 3 Drawing Sheets

DIFFERENTIAL AMPLIFIER

BACKGROUND OF THE INVENTION

1. Field of the Invention

The present invention relates to a differential amplifier and more specifically to a differential amplifier of wide dynamic range.

2. Description of the Prior Art

An example of prior-art differential amplifiers is disclosed in U.S. Pat. No. 4,600,893 of the same inventor, for instance, which is incorporated herein by reference. FIG. 1 shows a differential amplifier disclosed in this U.S. Patent. In the drawing, the differential amplifier roughly comprises a pair of NPN input transistors $Q_1$ and $Q_2$; a current mirror circuit 60, and a pair of PNP output transistors $Q_5$ and $Q_6$. Two base terminals 1 and 2 of the transistors $Q_1$ and $Q_2$ are two input terminals of the differential amplifier. A voltage difference $S_i$ between the first and second voltage signals applied to the gates of $Q_1$ and $Q_2$ is amplified by the differential amplifier. Two resistors $R_1$ and $R_2$ are connected in series between the two emitters of the transistors $Q_1$ and $Q_2$ and a constant current source I is connected between a junction point between $R_1$ and $R_2$ and ground. Two collectors of the transistors $Q_1$ and $Q_2$ are connected to a supply voltage $V_{cc}$ via two resistors $R_5$ and $R_6$, respectively and to two emitters of the PNP transistors $Q_5$ and $Q_6$, respectively. Two collectors of the transistors $Q_5$ and $Q_6$ are connected to the current mirror circuit 60. Two base terminals of the transistors $Q_5$ and $Q_6$ are connected in common to a first bias voltage $V_B$. Further, only the collector of $Q_6$ is connected to an output terminal 61, and a resistor $R_{63}$ is connected between the terminal 61 and the ground. The current mirror circuit 60 is composed of an NPN transistor $Q_{61}$ having the base and the collector connected to each other and to the collector of $Q_5$ and an NPN transistor $Q_{62}$ having the collector connected to the collector of $Q_6$. Further, two resistors $R_{61}$ and $R_{62}$ are connected between the emitters of $Q_{62}$ and $Q_{61}$ and ground, respectively.

A supply voltage is applied between a first potential terminal (e.g. ground) and a second potential terminal (e.g. $V_{cc}$), in FIG. 1.

In the prior-art differential amplifier shown in FIG. 1, currents flowing through the transistors $Q_5$ and $Q_6$ are controlled on the basis of a differential input signal $S_i$ applied between two input terminals 1 and 2. That is, when potential at the input terminal 1 is higher than that at the input terminal 2, the collector current flowing through the transistor $Q_1$ is larger than that flowing through the transistor $Q_2$. However, since current flowing through the resistor $R_5$ or $R_6$ is constant, the collector current flowing through the transistor $Q_6$ is higher than that flowing through the transistor $Q_5$, so that an output current flows through the output terminal 61 to rise the potential of the output signal $S_0$.

In this case, when the transistors $Q_5$ and $Q_6$ are kept unsaturated, the potential of the output signal $S_0$ cannot rise beyond the first bias voltage $V_B$, as shown in FIG. 2.

On the other hand, when the potential at the input terminal 1 is lower than that at the input terminal 2, the collector current of the transistor $Q_6$ is smaller than that of the transistor $Q_5$. Therefore, current flows from the output terminal 61 to the transistor $Q_{62}$, so that the potential of the output signal $S_0$ drops.

In this case, when the transistors $Q_5$ and $Q_6$ are kept unsaturated, the potential of the output signal $S_0$ cannot drop below $V_{BE62}+R_{62}$, where $V_{BE62}$ denotes a voltage between the base and the emitter of the transistor $Q_{62}$ and $R_{62}$ denotes a voltage drop across $R_{62}$, as shown in FIG. 2.

Further, when this differential amplifier is operated at high speed under the condition that the two input transistors $Q_1$ and $Q_2$ are unsaturated, the level of the input signal is limited below $(V_{cc}-V_5)$ or $(V_{cc}-V_6)$, where $V_5$ or $V_6$ denotes a voltage drop across the resistor $R_5$ or $R_6$.

In addition, since the two input transistors $Q_1$ and $Q_2$ are composed of bipolar transistors, there exists another problem in that base current should be passed through each input transistor $Q_1$ or $Q_2$.

In summary, in the prior-art differential amplifier as shown in FIG. 1, there exist various drawbacks as follows:

(1) When the amplifier is operated at high speed under unsaturated conditions, the upper limit of the output signal $S_0$ is $V_B$ or $(V_{cc}-V_6-V_{BE6})$ and the lower limit thereof is $V_{BE62}+V_{62}$ as shown in FIG. 2. Therefore, the output dynamic range is narrow, so that his amplifier is not usable when a high output signal level of $V_{cc}$ or a low output signal level of GND is required.

(2) Since the two input transistors $Q_1$ and $Q_2$ are bipolar transistors, base currents are required as the input currents of the transistors $Q_1$ and $Q_2$. Therefore, a driver circuit of relatively high power is required to be connected to the input terminals 1 and 2 of the differential amplifier.

SUMMARY OF THE INVENTION

With these problems in mind, therefore, it is the primary object of the present invention to provide a differential amplifier small in size, high in operating speed, and wide in dynamic range, and excellent in wideband characteristics.

To achieve the above-mentioned object, a differential amplifier of the present invention comprises: (a) first and second potential terminals between which a supply voltage is applied; (b) a pair of first and second voltage drop means connected to said first potential terminal; (c) a pair of first and second differential field effect transistors, having source terminals coupled to each other and further having a constant current source connected between a junction of the source terminals of said first and second field effect transistors and said second potential terminal and drain terminals connected to said first and second voltage drop means, for inputting a voltage difference between first and second voltage signals applied to the gates of said first and second field effect transistors, respectively; (d) a pair of third and fourth bipolar transistors complementary to said first and second field effect transistors, having base terminals connected to a first bias voltage in common and emitter terminals respectively connected to the drain terminals of said first and second field effect transistors, for amplifying the inputted voltage difference, one of collector terminals thereof being connected to an output terminal; and (e) a current mirror circuit composed of fifth and sixth field effect transistors of the same conductive type as said first and second field effect transistors, said current mirror circuit being connected between collector terminals of said third and fourth bipolar transistors and the second potential terminal.

The third and fourth bipolar transistors can be replaced with FETs having a complementary relationship to the first and second FETs.

Further, it is also preferable to connect a pair of seventh and eighth bipolar transistors complementary to the third and fourth FETs between the first and second FETs and the third and fourth FETs.

BRIEF DESCRIPTION OF THE DRAWINGS

The features and advantages of the differential amplifier according to the present invention will be more clearly appreciated from the following description of the preferred embodiments of the invention taken in conjunction with the accompanying drawings in which like reference numerals designate the same or similar elements throughout the figures thereof and in which.

DETAILED DESCRIPTION OF THE PREFERRED EMBODIMENTS

Figure 3:
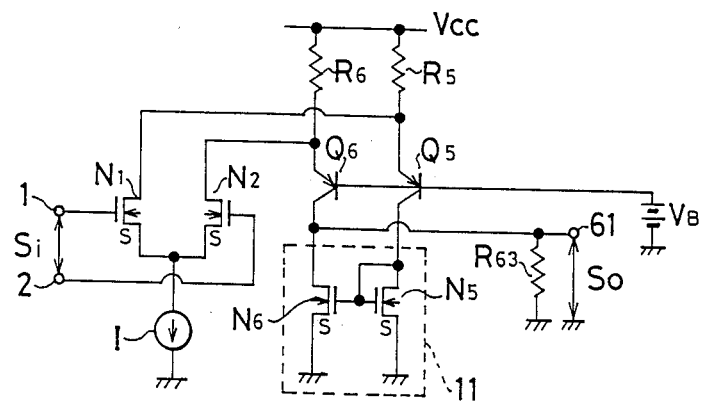
FIG. 3 is a circuit diagram showing a first embodiment of the differential amplifier of the present invention.

With reference to the attached drawings, embodiments of the present invention will be described hereinbelow. FIG. 3 show a first embodiment thereof, in which the feature of this differential amplifier is to constitute the input stage circuit and the current mirror circuit by N-channel field effect transistors (FETs).

In FIG. 3, the differential amplifier roughly comprises a pair of input N-channel FETs $N_1$ and $N_2$; a pair of output PNP bipolar transistors $Q_5$ and $Q_6$; and a current mirror circuit 11.

The gate terminal of the FET $N_1$ is connected to a first input terminal 1, and the gate terminal of the FET $N_2$ is connected to a second input terminal 2.

Two source terminals of the two FETs $N_1$ and $N_2$ are connected to each other, and the junction joint between the two is connected to ground (the second potential terminal) via a constant current source I. Two drain terminals of the two FETs $N_1$ and $N_2$ are connected to a supply voltage $V_{cc}$ (the first potential terminal) via resistors $R_5$ and $R_6$, respectively, and further to emitter terminals of the bipolar transistors $Q_5$ and $Q_6$, respectively, whose base terminals are connected to a first bias voltage $V_B$ in common. Further, each collector terminal of the transistors $Q_5$ and $Q_6$ is connected to the current mirror circuit 11 serving as loads for the two transistors $Q_5$ and $Q_6$.

The current mirror circuit 11 is composed of two N-channel FETs $N_5$ and $N_6$. Two gate terminals of the FETs $N_5$ and $N_6$ are connected to each other, and two source terminals thereof are grounded. The drain terminal of the FET $N_5$ is connected to the gate terminal of the same FET $N_5$ and further to the collector terminal of the transistor $Q_5$. Further, the drain terminal of the FET $N_6$ is connected to the collector terminal of the transistor $Q_6$.

Figure 1:
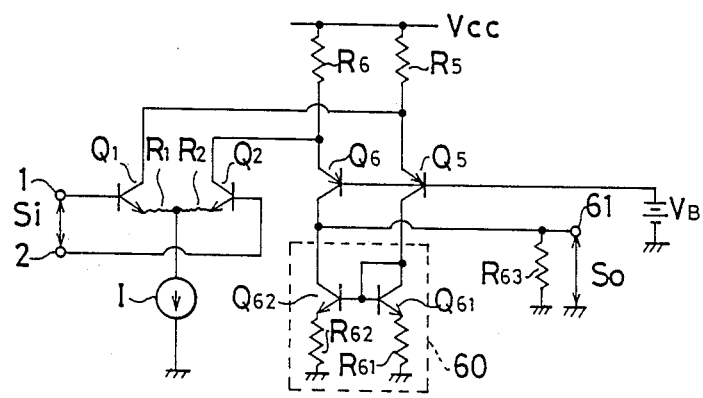
FIG. 1 is a circuit diagram showing an example of prior-art differential amplifier.

The circuit configuration other than described above is substantially the same as the prior-art circuit shown in FIG. 1, so that the description thereof being omitted herein without repetition.

In the differential amplifier shown in FIG. 3, when the potential of the input terminal 1 is higher than that of the input terminal 2, although the drain current of the FET $N_1$ is higher than that of the FET $N_2$, since current flowing through the resistor $R_5$ or $R_6$ is constant (the current value can be adjusted according to the first bias voltage $V_B$), the collector current of the transistor $Q_6$ is larger than that of the transistor $Q_5$. Therefore, part of the collector current of the transistor $Q_6$ flows to the output terminal 61, because drain currents of the FET $N_5$ and $N_6$ are equal to each other; as a result, the output potential $S_0$ rises to $V_B$ as shown in FIG. 2.

Figure 2:
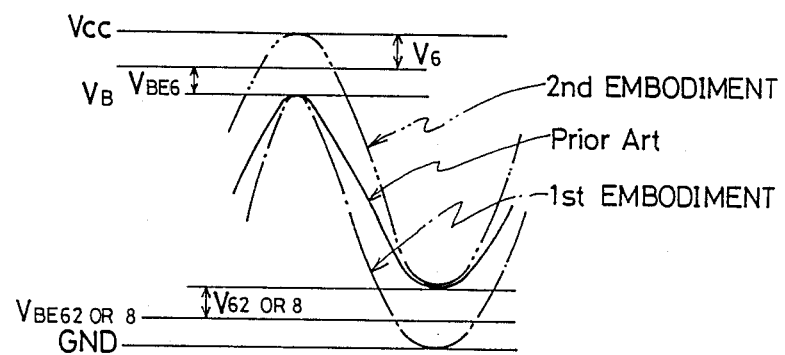
FIG. 2 is a waveform diagram showing operating waveforms of the prior-art differential amplifier in comparison with those of the present invention.

On the other hand, when the potential of the input terminal 1 is lower than that of the input terminal 2, since the drain current of the input FET $N_1$ becomes smaller than that of the input FET $N_2$ but larger than the collector current of the transistor $Q_6$, current flows from the output terminal 61 to the ground via the FET $N_6$, so that the potential of the output terminal 61 drops down to the ground level, as shown in FIG. 2.

As described above, since the low voltage level of the output signal $S_0$ reaches the ground level, it is possible to broaden the dynamic range on the low voltage level side of the output signal. In other words, this first embodiment is applicable to a circuit in which ground level is required for the low voltage level of the output signal $S_0$.

Further, since the input stage is composed of two FETs $N_1$ and $N_2$, the upper limit level of the input signal $S_i$ applied to between two input terminals 1 and 2 is not limited by the resistors $R_1$ and $R_2$ as in the prior art circuit, thus broadening the input dynamic range.

Further, since the gate currents (input currents) of the two FETs $N_1$ and $N_2$ are extremely smaller than the base currents of the bipolar transistors, it is possible to increase the input impedance markedly, and therefore to use a driver circuit of small current driving capability.

Figure 4:
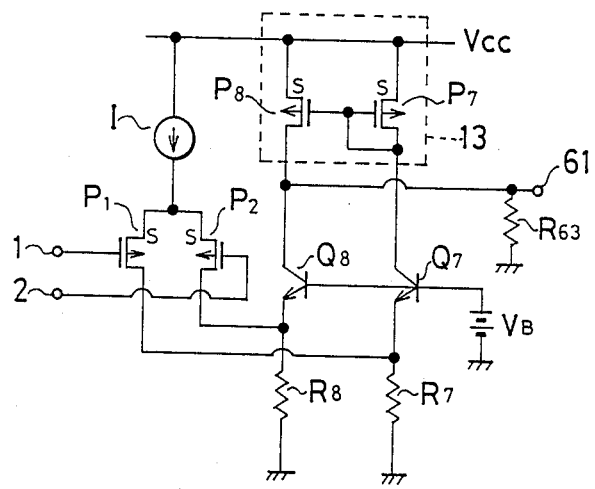
FIG. 4 is a circuit diagram showing a second embodiment of the present invention.

FIG. 4 shows a second embodiment of the present invention, in which the feature of this differential amplifier is to constitute the input stage by P-channel FETs $P_1$ and $P_2$.

In FIG. 4, a gate terminal of the FET $P_1$ is connected to the input terminal 1 and a gate terminal of the FET $P_2$ is connected to the input terminal 2. Source terminals of the FETs $P_1$ and $P_2$ are connected to each other, and the junction point between the two is connected to a supply voltage $V_{cc}$ via a constant current source I. Further, drain terminals of the input FETs $P_1$ and $P_2$ are connected to ground via two resistors $R_7$ and $R_8$, respectively and further to two emitters of NPN transistors $Q_7$ and $Q_8$, respectively, whose base terminals are connected to a bias voltage $V_B$ in common. Two collector terminals of the transistors $Q_7$ and $Q_8$ are connected to a current mirror circuit 13, respectively.

This current mirror circuit 13 is composed of two P-channel FETs $P_7$ and $P_8$. The gate terminals of the FETs $P_7$ and $P_8$ are connected to each other, and the source terminals thereof are connected to a supply voltage $V_{cc}$. Further, the drain terminal of the FET $P_7$ is connected to the gate terminal thereof and further to the collector terminal of the transistor $Q_7$. Further, the drain terminal of the FET $P_8$ is connected to the collector terminal of the transistor $Q_8$ and the output terminal 61.

In the differential amplifier as shown in FIG. 4, currents flowing through the two transistors $Q_7$ and $Q_8$ can be controlled according to a differential input signal, and a differential input signal can be amplified and outputted from the output terminal 61 as a differential output signal in phase with the input signal.

In this amplifier, since current flows from the supply voltage $V_{cc}$ to the output terminal 61 via the FET $P_8$ and therefore the potential of the output terminal 61 can rise up to $V_{cc}$ level as shown in FIG. 2, it is possible to broaden the output dynamic range.

Further, since the input stage is composed of P-channel FETs, it is possible to increase the input impedance markedly as in the first embodiment. In addition, since noise generated from the P-channel FETs is lower than that generated from the N-channel FETs, the input sensitivity of this second embodiment is higher than that of the first embodiment.

Figure 5:
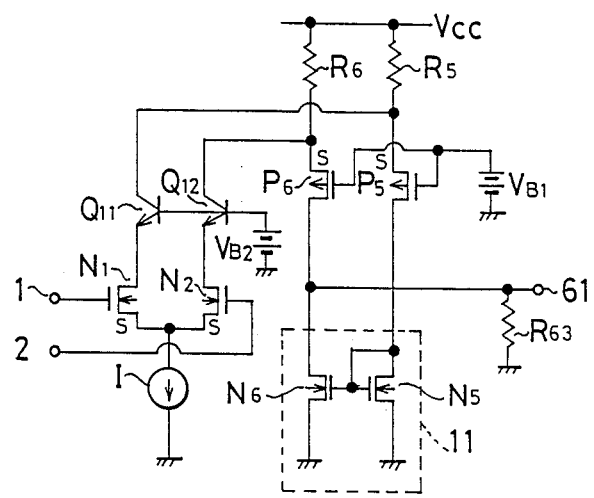
FIG. 5 is a circuit diagram showing a third embodiment of the present invention.

FIG. 5 shows a third embodiment of the present invention, in which the bipolar transistors $Q_5$ and $Q_6$ of the first embodiment (shown in FIG. 3) are replaced with the two P-channel FETs $P_5$ and $P_6$ whose gate terminals are connected to the first bias voltage $V_{B1}$ in common, and further a pair of NPN bipolar transistors $Q_{11}$ and $Q_{12}$ whose base terminals are connected to a second bias voltage $V_{B2}$ in common are connected between two drain terminals of the input FETs $N_1$ and $N_2$ and the two source terminals of the FETs $P_5$ and $P_6$, respectively.

The fundamental circuit operation of this third embodiment shown in FIG. 5 is substantially the same as that of the first embodiment shown in FIG. 3.

Figure 6:
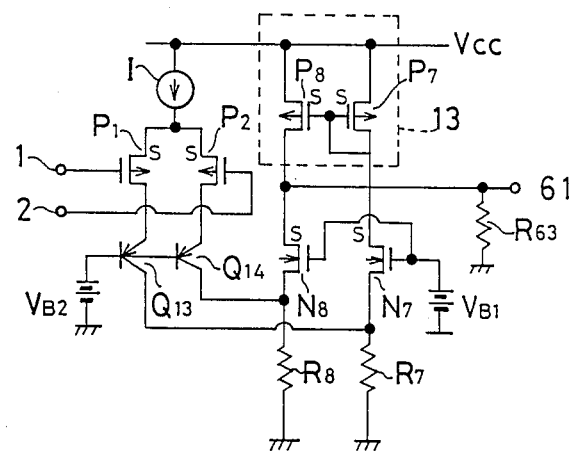
FIG. 6 is a circuit diagram showing a fourth embodiment of the present invention.

FIG. 6 show a fourth embodiment of the present invention, in which the bipolar transistors $Q_7$ and $Q_8$ of the second embodiment (shown in FIG. 4) are replaced with two N-channel FETs $N_7$ and $N_8$ whose gate terminals are connected to the first bias voltage $V_{B1}$, and further a pair of PNP transistors $Q_{13}$ and $Q_{14}$ whose base terminals are connected to the second bias voltage $V_{B2}$ in common are connected between two drain terminals of the input FETs $P_1$ and $P_2$ and the drain terminals of the FETs $N_7$ and $N_8$, respectively.

The fundamental circuit operation of this fourth embodiment shown in FIG. 6 is substantially the same as that of the second embodiment shown in FIG. 4.

Further, the resistor $R_5$ and $R_6$ connected to the FETs $P_5$ and $P_6$, as loads in FIG. 5 or the resistors $R_7$ and $R_8$ connected to the FETs $N_7$ and $N_8$ as loads in FIG. 6 can be replaced with constant current sources, respectively.

As described above, in the differential amplifier of the present invention, since currents flowing through a pair of input FETs can be controlled according to a differential input signal and further current flowing between the output terminal and the FET current mirror circuit can be controlled by a pair of output transistors or FETs, a differential input signal can be amplified in response to extremely small input currents at high speed with a wide dynamic range and excellent wideband characteristics.

What is claimed is:
1. A differential amplifier comprising:
   (a) first and second potential terminals between which a supply voltage is applied;
   (b) a pair of first and second voltage drop means connected to said first potential terminal;
   (c) a pair of first and second differential field effect transistors, having source terminals coupled to each other and further having a constant current source connected between a junction of the source terminals of said first and second field effect transistors and said second potential terminal and drain terminals connected to said first and second voltage drop means, for inputting a voltage difference between first and second voltage signals applied to the gates of said first and second field effect transistors, respectively;
   (d) a pair of third and fourth bipolar transistors complementary to said first and second field effect transistors, having base terminals connected to a first bias voltage in common and emitter terminals respectively connected to the drain terminals of said first and second field effect transistors, for amplifying the inputted voltage difference, one of collector terminals thereof being connected to an output terminal; and
   (e) a current mirror circuit composed of fifth and sixth field effect transistors of the same conductive type as said first and second field effect transistors, said current mirror circuit being connected between collector terminals of said third and fourth bipolar transistors and the second potential terminal.

2. The differential amplifier as set forth in claim 1, wherein said first and second voltage drop means comprise.
   (a) a first resistor coupled between said first potential terminal and the emitter of said third bipolar transistor; and
   (b) a second resistor coupled between said first potential terminal and the emitter of said fourth bipolar transistor.

3. The differential amplifier as set forth in claim 1, wherein said first and second field effect transistors are of N-channel type; said third and fourth bipolar transistors are of PNP type; and said fifth and sixth field effect transistors are of N-channel type.

4. The differential amplifier as set forth in claim 1, wherein said first and second field effect transistors are of P-channel type; said third and fourth bipolar, transistor are of NPN type; and said fifth and sixth field effect transistors are of P-channel type.

5. A differential amplifier comprising:
   (a) first and second potential terminals between which a supply voltage is applied;
   (b) a pair of first and second voltage drop means connected to said first potential terminal;
   (c) a pair of first and second differential field effect transistors, having source terminals coupled to each other and further having a constant current source connected between a junction of the source terminals of said first and second field effect transistors and said second potential terminal;
   (d) a pair of third and fourth field effect transistors complementary to said first and second field effect transistors, having gate terminals connected to a first bias voltage in common, a drain terminal of one of said third and fourth field effect transistors being connected to an output terminal and source terminals being respectively connected to said first and second voltage drop means;

(e) a current mirror circuit composed of fifth and sixth field effect transistors of the same conductive type as said first and second field effect transistors, said current mirror circuit being connected between drain terminals of said third and fourth field effect transistors and the second potential terminal; and (f) a pair of seventh and eight bipolar transistors connected between drain terminals of said first and second field effect transistors and source terminals of said third and fourth field effect transistors, base terminals of said seventh and eighth bipolar transistors being connected in common to a second bias voltage.

6. A differential amplifier comprising:

(a) first and second potential terminals between which a supply voltage is applied;

(b) a pair of first and second voltage drop means connected to said first potential terminal;

(c) a pair of first and second differential field effect transistors, having source terminals coupled to each other and further having a constant current source connected between a junction of the source terminals of said first and second field effect transistors and said second potential terminal;

(d) a pair of third and fourth field effect transistors complementary to said first and second field effect transistors, having gate terminals connected to a first bias voltage in common, a source terminal of one of said third and fourth field effect transistors being connected to an output terminal and drain terminals respectively connected to said first and second voltage drop means;

(e) a current mirror circuit composed of fifth and sixth field effect transistors of the same conductive type as said first and second field effect transistors, said current mirror circuit being connected between source terminals of said third and fourth field effect transistors and the second potential terminal; and (f) a pair of seventh and eight bipolar transistors connected between drain terminals of said first and second field effect transistors and drain terminals of said third and fourth field effect transistors, base terminals of said seventh and eighth bipolar transistors being connected in common to a second bias voltage.

* * * * *